(12) United States Patent
Karpov et al.

(10) Patent No.: US 8,462,537 B2
(45) Date of Patent: Jun. 11, 2013

(54) METHOD AND APPARATUS TO RESET A PHASE CHANGE MEMORY AND SWITCH (PCMS) MEMORY CELL

(75) Inventors: Elijah V. Karpov, Santa Clara, CA (US); Gianpaolo Spadini, Scotts Valley, CA (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 13/052,211

(22) Filed: Mar. 21, 2011

(65) Prior Publication Data

US 2012/0243306 A1 Sep. 27, 2012

(51) Int. Cl.
*G11C 11/00* (2006.01)

(52) U.S. Cl.
USPC .......................................... 365/148; 365/163

(58) Field of Classification Search
USPC ..................... 365/148, 163, 189.05
See application file for complete search history.

(56) References Cited

U.S. PATENT DOCUMENTS

| | | | |
|---|---|---|---|
| 5,761,118 A | 6/1998 | Chai | |
| 6,094,368 A | 7/2000 | Ching | |
| 7,099,180 B1 | 8/2006 | Dodge et al. | |
| 7,778,059 B2 | 8/2010 | Chang | |
| 2008/0049512 A1 | 2/2008 | Seidel et al. | |
| 2010/0046296 A1 | 2/2010 | Liao | |
| 2011/0051499 A1* | 3/2011 | Hamilton | 365/148 |
| 2012/0026779 A1* | 2/2012 | Ikegami et al. | 365/148 |
| 2012/0176846 A1* | 7/2012 | Sutardja | 365/189.05 |

FOREIGN PATENT DOCUMENTS

| | | |
|---|---|---|
| WO | 2012/128938 A2 | 9/2012 |
| WO | 2012/128938 A3 | 10/2012 |

OTHER PUBLICATIONS

International Search Report and Written Opinion Received for PCT Patent Application No. PCT/US2012/027895, Mailed on Sep. 26, 2012, 9 pages.

* cited by examiner

*Primary Examiner* — Vu Le
(74) *Attorney, Agent, or Firm* — Winkle, PLLC

(57) ABSTRACT

The present disclosure relates to the fabrication of non-volatile memory devices. In at least one embodiment, the non-volatile memory of the present disclosure may include a phase change memory and switch (hereinafter "PCMS") memory cell and a process for resetting the PCMS memory utilizing a "look-up" table to calculate a current required to place a bit above a reference level to maximum threshold voltage.

13 Claims, 7 Drawing Sheets

METHOD AND APPARATUS TO RESET A PHASE CHANGE MEMORY AND SWITCH (PCMS) MEMORY CELL

BACKGROUND OF THE INVENTION

The present disclosure relates generally to the fabrication of microelectronic memory. The microelectronic memory may be non-volatile, wherein the memory can retain stored information even when not powered.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
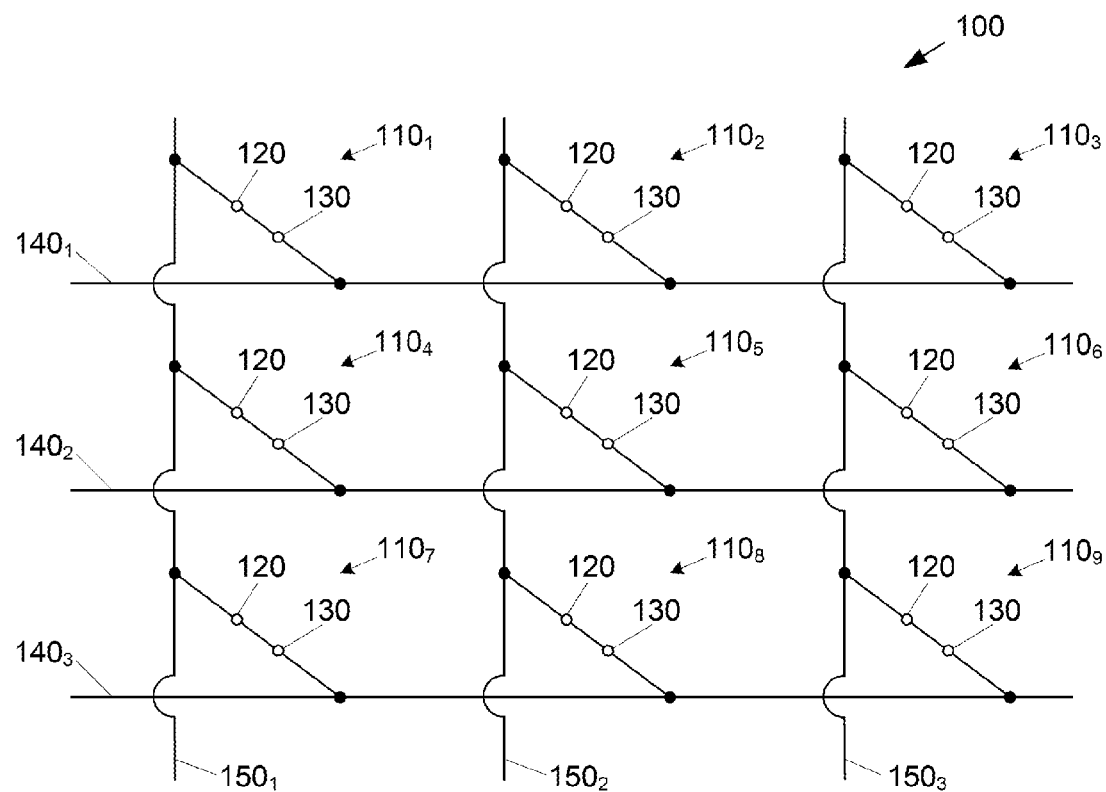
FIG. 1 is a schematic depiction illustrating a phase change memory array.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the operation of non-volatile memory devices. In at least one embodiment, the non-volatile memory of the present disclosure may include a phase change memory and switch (hereinafter "PCMS") and a process for resetting the PCMS utilizing a "look-up" table to calculate a current required to place a bit above a reference level to a maximum threshold voltage.

Figure 2:
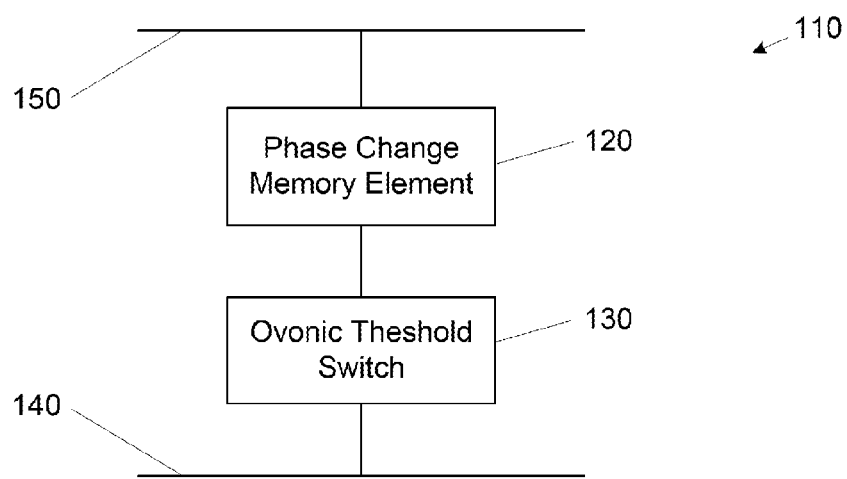
FIG. 2 is a schematic depiction illustrating a phase change memory stack.

FIG. 1 shows a memory array 100 comprising, for illustration purposes, a 3×3 array of memory cells $110_1$-$110_9$, and FIG. 2 shows a single memory cell 110 (analogous to any of memory cells $110_1$-$110_9$ of FIG. 1). Each memory cell (110 and $110_1$-$110_9$) may include a phase change memory element 120 and an ovonic threshold switch 130.

The memory array 100 may include column lines $150_1$, $150_2$, and $150_3$ (shown as element 150 in FIG. 2) and row lines 140, $140_1$, $140_2$, and $140_3$ (shown as element 140 in FIG. 2) to select a particular memory cell of the array during a write or read operation. The column lines 150, $150_1$, $150_2$, and $150_3$ and the row lines 140, $140_1$, $140_2$, and $140_3$ may also be referred to as "address lines" since these lines may be used to address memory cells 110, $110_1$-$110_9$ during programming or reading. The column lines 150, $150_1$, $150_2$, and $150_3$ may also be referred to as "bit lines", and the row lines 140, $140_1$, $140_2$, and $140_3$ may also be referred to as "word lines". Further, it is understood that the 3×3 array of FIG. 1 is merely exemplary and may be any appropriate size (i.e. any number of memory cells).

The phase change memory elements 120 may be connected to the column lines 150, $150_1$, $150_2$, and $150_3$ and may be coupled to the row lines 140, $140_1$, $140_2$, and $140_3$ through the ovonic threshold switch 130. Each ovonic threshold switch 130 may be connected in series to each phase change memory element 120 and may be used to access each phase change memory element 120 during programming or reading of each phase change memory element 120. When a particular memory cell (e.g., memory cell 110 of FIG. 2) is selected, voltage potentials may be applied to its associated column line (e.g., element 150 of FIG. 2) and row line (e.g., element 140 of FIG. 2) to apply a voltage potential across the memory cell. It is understood that each ovonic threshold switch 130 could positioned between each phase change memory element 120 and the column lines 150, $150_1$, $150_2$, and $150_3$ with each phase change memory element 120 coupled to the row lines 140, $140_1$, $140_2$, and $140_3$. It is also understood that more than one ovonic threshold switch 130 could be used within each memory cell 110, 110₁-110₉.

Figure 3:
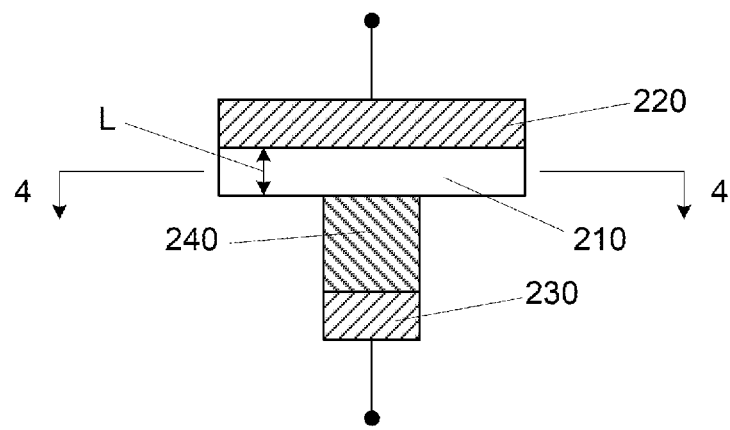
FIG. 3 is a schematic depiction illustrating physical elements within a phase change memory stack.
Figure 4:
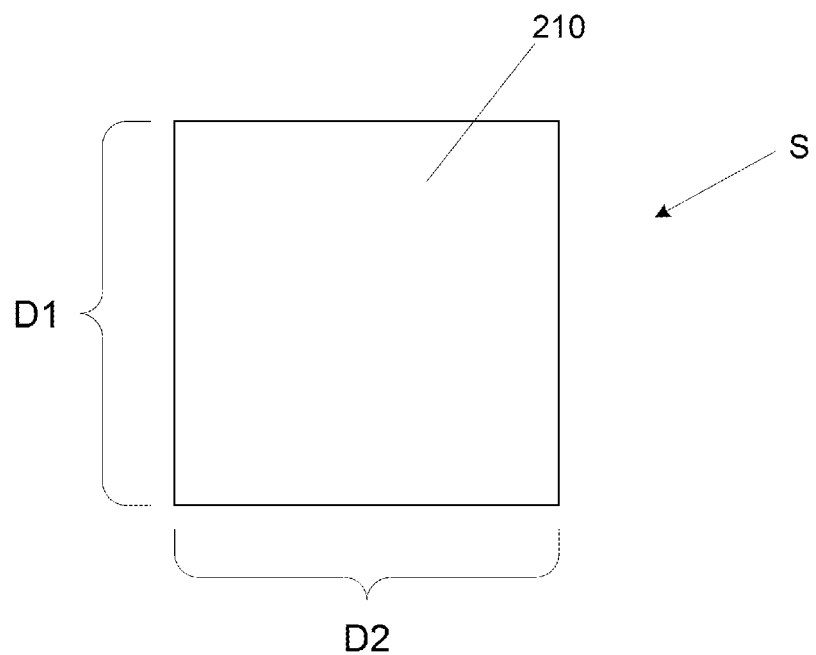
FIG. 4 is a schematic depiction illustrating the area of the phase change material layer within the phase change memory stack of FIG. 3, along line 4-4 thereof.

The phase change memory elements 120 operate based on the phase changing properties of a phase change material layer 210, which is interposed between an upper electrode 220 and a lower electrode 230 (with a resistive heating element 240 between lower electrode and the phase change layer 210), as shown in FIG. 3. As a current is applied, the phase change material layer 210 undergoes a phase change between the amorphous state and the crystalline state due to heat generated by the resistive heating element 240 and/or by the phase change material layer 210 (by the Joule effect). It is noted that the lower electrode 230/resistive heating element 240 may have a surface area smaller than the surface area for the phase change material layer 210 at an interface therebetween to concentrate the Joule heating from the resistive heating element 240. The phase change material layer 210 may have a device thickness "L" as shown in FIG. 3 and the device area "S", as shown in FIG. 4. In the illustration in FIG. 4, the surface area S would be a first dimension D1 of the phase change material layer 210 times a second dimension D2 of the phase change material layer 210.

The phase change memory element 120 may be include a chalcogenide layer as a phase change element therein. The chalcogenide layer may comprise an element of the VI group of the period table (e.g. selenium (Se), tellurium (Te), etc.), usually combined with IV and V groups elements (e.g. germanium (Ge), arsenic (As), antimony (Sb), etc.).

The state to which a PCMS memory cell is programmed is determined by sensing its threshold voltage. The "SET" state corresponds to a low threshold voltage and a "RESET" state to a high threshold voltage. A SET bit in a phase change memory may be programmed to a RESET bit using a series of electrical pulses of increasing amplitude. After an initial pulse is applied a check or verification cycle is performed to determine whether the bit has been RESET. If not, a higher amplitude pulse is applied. Each time the pulse amplitude is incrementally increased, another check or verification cycle is performed to determine whether the bit has been RESET or whether a maximum safe pulse amplitude has been reached or exceeded. The pulse amplitude is continually incremented until either the maximum safe pulse amplitude is reached or all of the bits to be programmed have been programmed into the correct RESET state (i.e. required threshold voltage is reached). However, by programming in this manner, some bits may require up to 25 or more programming pulses, which would limit the speed of a write operation. A SET bit in phase change memory may be programmed to a RESET bit using a single electrical pulse. However, small physical or layout differences among memory cells in a memory array may result in a wide distribution of threshold voltage in the memory array.

In one embodiment of the present description, a "look-up" table is generated based on either actual data collected or a adaptive algorithm/equation. The look-up table determines the current required to place a memory bit above a reference level (e.g. the minimum threshold voltage, $V_t$min) to achieved approximately the maximum threshold voltage, $V_t$max, instead of applying a sequence of pulses of increasing amplitude until the required maximum threshold voltage, $V_t$max, is substantially reached.

With the use of a look-up table to determine the current required to place a memory bit above the reference level to approximately the maximum threshold voltage, $V_t$max, a reduction in the number of programming pulses/verify cycles may be achieved and a tight threshold voltage distribution for all memory cells in a memory array may be obtained. The reduction in the number of programming pulses/verify cycles may be accomplished because the threshold voltage vs. programming current ($V_t$I) slope is known via the generation of the look-up table.

It has been indicated through physical modeling of phase change memory and switch cell operation that there is a relationship between threshold voltage, $V_t$, and programming current, I. This relationship can be approximated by the equation as follows:

$$V_t = V_t\text{min} + (E_{th} \cdot L \cdot [1 - ((J_{cr} \cdot S)^2/I^2)]) \qquad \text{Equation 1}$$

where: $V_t$ is the threshold voltage
$V_t$min is a reference minimum threshold voltage
$E_{th}$ is a parameter based on the phase change material used with some sensitivity to the device architecture
L is the device thickness
$J_{cr}$ is a parameter based on the phase change material used with some sensitivity to the device architecture
S is the device area
I is the current With regard to the $E_{th}$ and $J_{cr}$ parameters of Equation 1, these parameters are primary determined by the materials used for the PCMS memory cell, though they have some sensitivity to the architecture of the device. In one embodiment, $E_{th}$ may be about 3.2e5 V/cm. In another embodiment, $J_{cr}$ may be about 1.2e7 A/cm². The look-up table may be based on Equation 1 or its approximation; however these become parameters which can be technology node, product, microelectronic die, or even block dependent, as will be understood to those skilled in the art.

From Equation 1, it can be seen that the sensitivity of threshold voltage ($V_t$) to the device area (S) is higher than that for the device thickness (L). For example, about a 5% change in the device thickness (L) can result in about a 5% change in the threshold voltage ($V_t$), whereas about a 5% change in the device area (S) in about a 10% change in threshold voltage ($V_t$).

As will be understood to those skilled in the art, Equation 1 allows prediction any threshold voltage ($V_t$) values as soon as the initial current ($I_0 = J_{cr} \cdot S$) is known.

Figure 5:
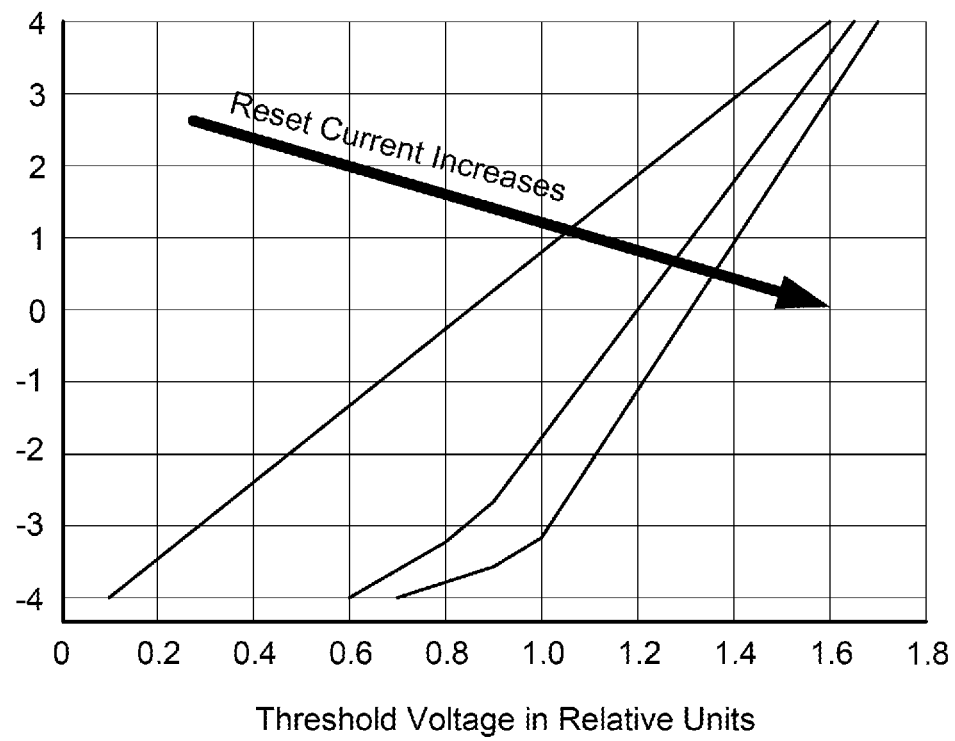
FIG. 5 is a graph of threshold voltage distributions in a phase change memory and switch (PCMS) array based on experiment data.
Figure 6:
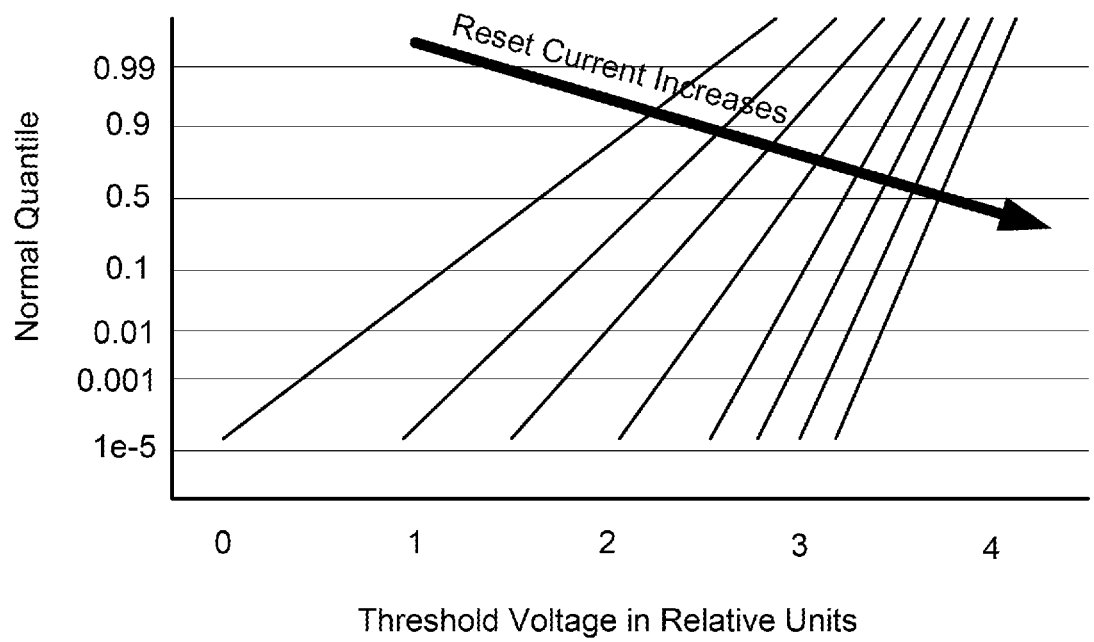
FIG. 6 is a graph of threshold voltage distributions in a phase change memory and switch array based on data generate by an equation approximation of its operation.

FIG. 5 illustrates a graph of the cumulative probability of threshold voltages in a phase change memory and switch (PCMS) array based on actual data (approximated for illustrative purposes) and FIG. 6 illustrates a graph of threshold voltage distributions in a phase change memory and switch array based on data generated (approximated for illustrative purposes) by Equation 1 for a memory array for which both the area and the thickness of the phase change material layer 210 vary with normal distribution probability, as will be understood to those skilled in the art. Furthermore, FIG. 6 confirms Equation 1 and threshold voltage sensitivity to geometrical features, such as the phase change material layer area and thickness.

Figure 7:
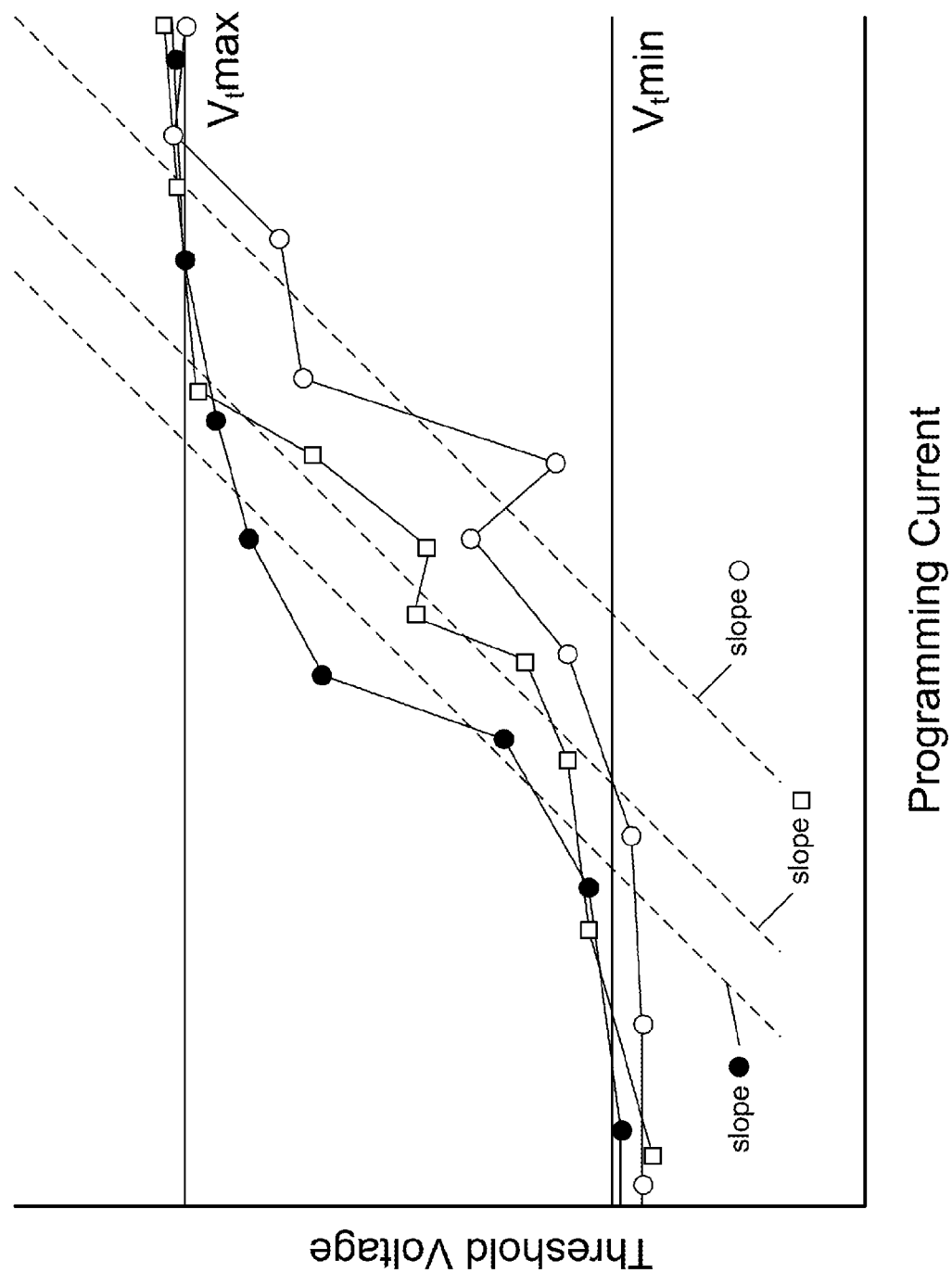
FIG. 7 is a graph of threshold voltage vs. programming current (VtI) curves.
Figure 8:
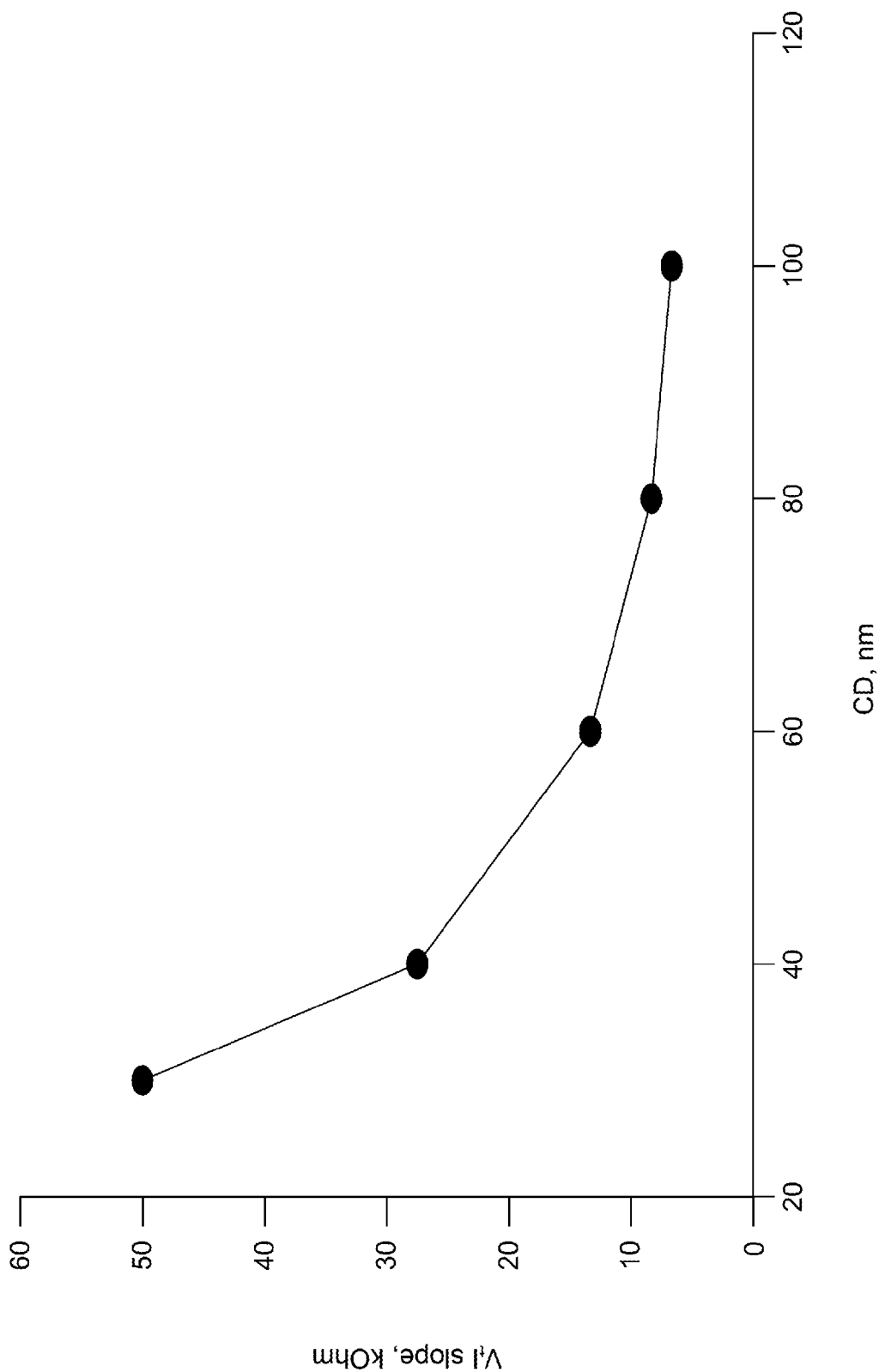
FIG. 8 is a graph of the slope of the threshold voltage vs. programming current as a function of the line critical dimension of the PCMS memory device.

Thus, Equation 1 may allow for designing a sequence of pulses to effectively place any memory cell in the memory array above the specified threshold voltage. This is possible because the slope of the threshold voltage vs. programming current ($V_t$I) curve, as shown in FIG. 7, is known and only the current at which the threshold voltage ($V_t$) increases, i.e. $I_0$, is needed to calculate the final current need to reach a required threshold voltage. The dependence of the slope of voltage vs. programming current ($V_t$I) curve as a function of the line critical dimension (or half pitch) of the PCMS memory cell, as shown in FIG. 8.

Figure 9:
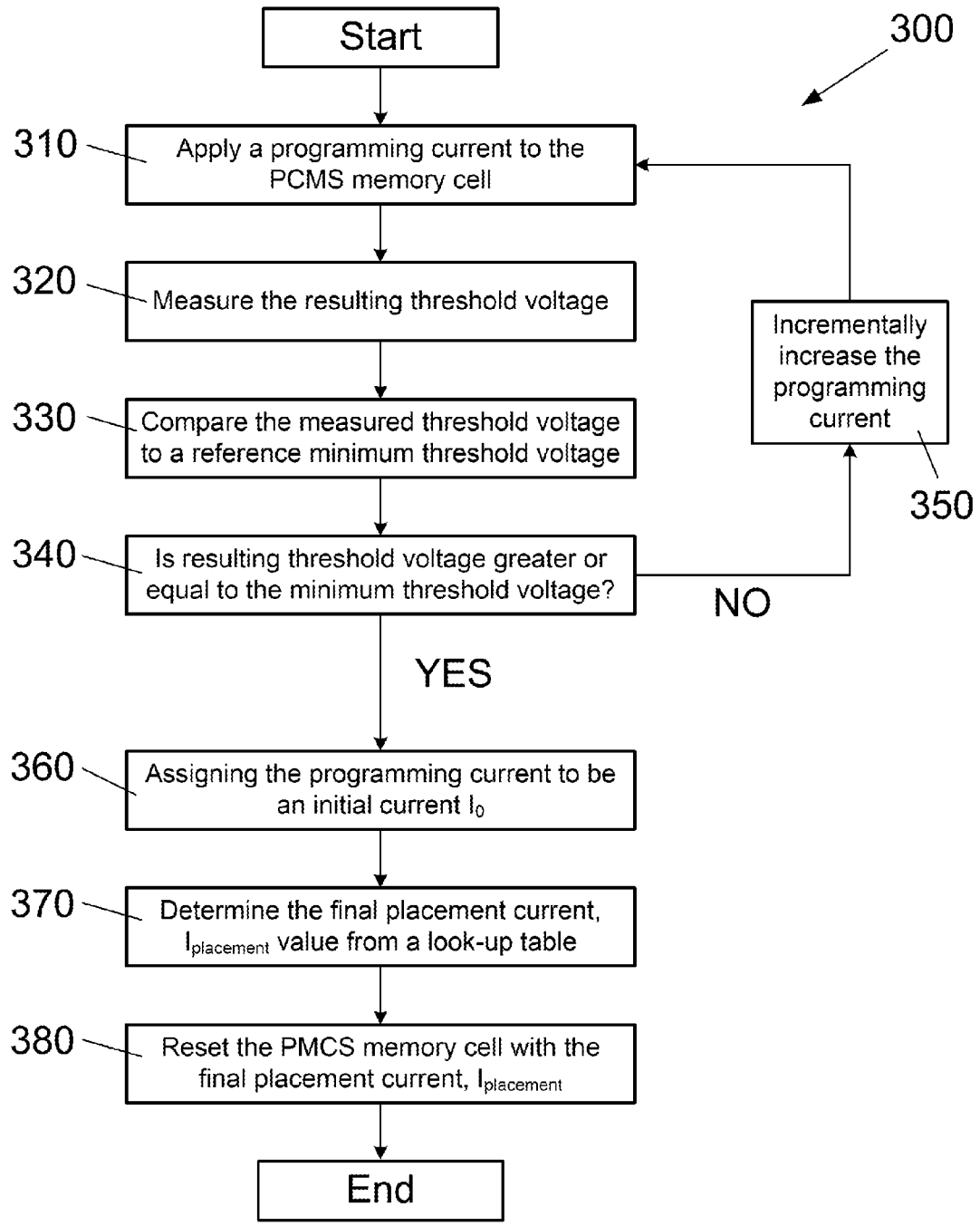
FIG. 9 is a flow diagram of bringing a memory bit to a RESET state according to one embodiment of the present description.

FIG. 9 illustrates a fundamental process for utilizing a look-up table to reset a PCMS memory cell. As shown in block 310, a programming current may be applied to the PCMS memory cell. The threshold voltage $V_t$ of the memory cell resulting from the applied programming current is measured, as shown in block 320. The measured threshold voltage $V_t$ is compared to a reference minimum threshold voltage, $V_t\text{min}$, as shown in block 330. As shown in block 340, if the threshold voltage $V_t$ of the memory cell is not greater or equal to the reference minimum threshold voltage, $V_t\text{min}$, then the programming current is incrementally increased, as shown in block 350, and blocks 310, 320, 330, and 340 are repeated. If the threshold voltage $V_t$ of the memory cell is greater or equal to the reference $V_t\text{min}$, the current applied becomes the initial current, $I_0$, as shown in block 360. As shown in block 370, once the initial current $I_0$ is determine, a final placement programming current, $I_{placement}$, value is determined from a look-up based on the value of the initial current $I_0$. As shown in block 380, the PMCS memory may be reset with the final placement current, $I_{placement}$.

With regard to block 370 of FIG. 9, an example of a look-up table, where the placement current, $I_{placement}$, has be determined to be 3 times the initial current, $I_0$, is shown in Table 1, as follows:

TABLE 1

| Initial current, $I_0$ (microamps) | Placement current, $I_{placement}$ (microamps) |
|---|---|
| 100 | 300 |
| 125 | 375 |
| 150 | 450 |
| 175 | 525 |
| 200 | 600 |

The look-up table is a correlation of a predicted programming current needed to substantially result in a maximum threshold voltage to RESET the PCMS memory cell based on an initial current which substantially results in a minimum threshold voltage. Thus, if a initial current, $I_0$, of 100 microamps is found to achieve the minimum threshold voltage, then the placement current, $I_{placement}$, of 300 microamps will be used from the look-up table to achieve the RESET of the PCMS memory cell. The use of the look-up table may result in an placement current, $I_{placement}$, within about 10% of the maximum voltage threshold $V_t\text{max}$. Thus, a reduction in the number of programming pulses/verify cycles may be achieved and a tight threshold voltage distribution for all memory cells in a memory array may be obtained.

It is understood that the process flow shown in FIG. 9 and the look-up table shown in Table 1 are simple illustrations, and that the process flow may be much more involved and the look-up table much more elaborate without departing from spirit and scope of the present description. Again, it is understood that the exact values in the look-up table can be technology node specific, product specific, microelectronic die specific, or even block specific.

Figure 10:
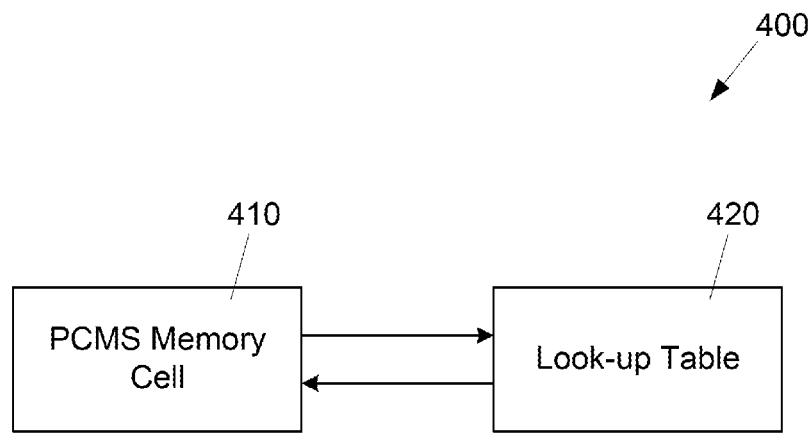
FIG. 10 is a schematic depiction of a PCMS memory system in accordance with one embodiment of the present description.

In its most fundamental form, as shown in FIG. 10, the PCMS memory system 400 may include at least one PCMS memory cell 410 that is accessible to a look-up table 420, wherein the look-up table is utilized to reset the PCMS memory cell 410. The look-up 420 may be stored internal to the memory system.

Figure 11:
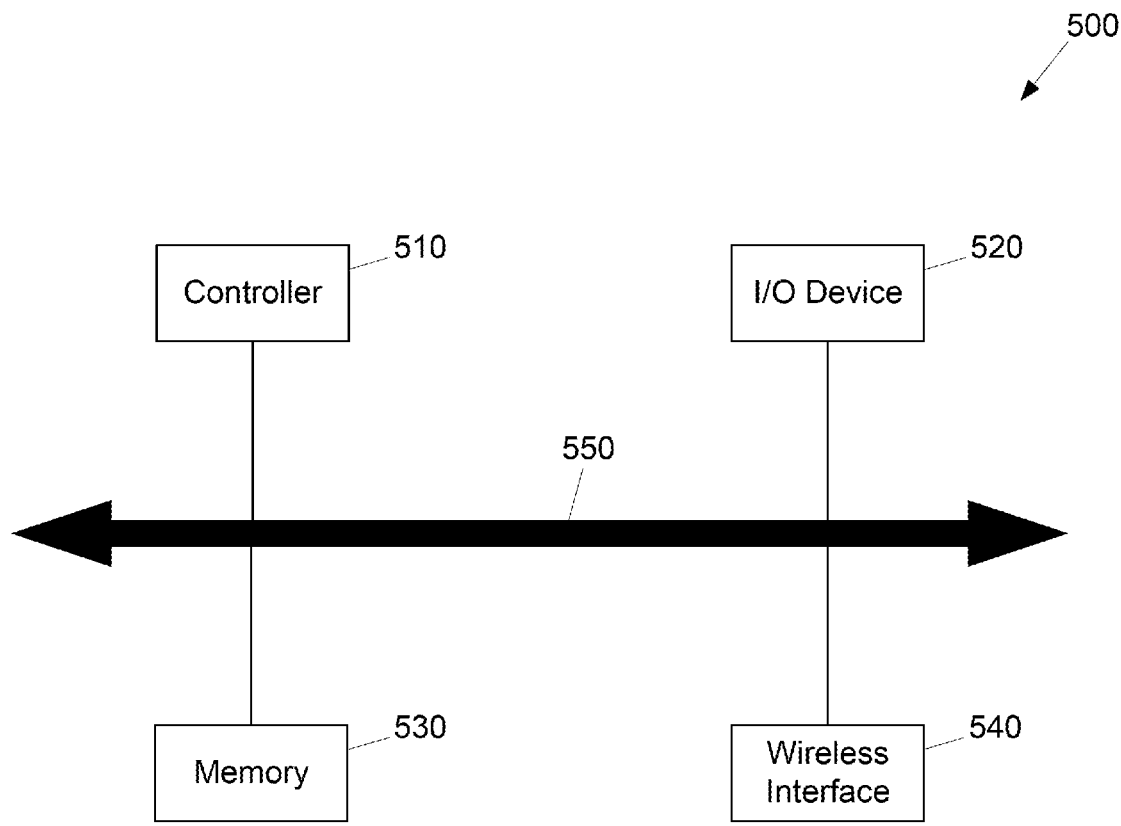
FIG. 11 is a schematic depiction of a system in accordance with one embodiment of the present description.

FIG. 11 illustrates an example of a microelectronic system 500 utilizing the subject matter of the present description. The microelectronic system 500 may be any electronic device, including but not limited to portable devices, such as a portable computer, a mobile telephone, a digital camera, a digital music player, a web tablet, a personal digital assistant, a pager, an instant messaging device, or other devices. The microelectronic system 500 may be adapted to transmit and/ or receive information wirelessly, such as through a wireless local area network (WLAN) system, a wireless personal area network (WPAN) system, and/or a cellular network.

The microelectronic system 500 may include a controller 510, an input/output (I/O) device 520 (e.g. a keypad, display, and the like), a memory 530, and a wireless interface 540 coupled to each other via a bus 550. It is understood that the scope of the present invention is not limited to embodiments having any or all of these components.

The controller 510 may comprise, for example, one or more microprocessors, digital signal processors, application specific integrated circuits, microcontrollers, or the like. The memory 530 may be used to store messages transmitted to or by system 500. The memory 530 may also optionally be used to store instructions that are executed by controller 510 during the operation of system 500, and may be used to store user data. The memory 530 may be may include at least one PCMS memory cell that is assessable to a look-up table, wherein the look-up table is utilized to reset the PCMS memory cell discussed herein.

The I/O device 520 may be used by a user to generate a message. The system 500 may use the wireless interface 540 to transmit and receive messages to and from a wireless communication network with a radio frequency (RF) signal. Examples of the wireless interface 540 may include an antenna or a wireless transceiver, although the scope of the present invention is not limited in this respect.

By referencing the microelectronic system 500 of FIG. 11, one skilled in the art will understand that the microelectronic system 500 or a computer may include a computer program product stored on a computer readable memory or medium, wherein the computer program may be adapted to be executed within the microelectronic system 500 or on a computer to access a look-up table, wherein the look-up table is utilized to reset a PCMS memory cell, in a manner discussed herein.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. A method comprising:
  incrementally increasing a programming current to a memory cell until a threshold voltage resulting from the incremented programming current is greater or equal to a reference minimum threshold voltage;
  assigning the programming current to be an initial current when the threshold voltage is greater or equal to the reference minimum threshold voltage;
  determining a final placement programming current value from a look-up based on the value of the initial current; and
  resetting the memory cell with the final placement programming current.
2. The method of claim 1, wherein incrementally increasing the programming current comprises:
  applying a programming current to a memory cell;
  measuring a resulting threshold voltage from the memory cell;
  comparing the measured threshold voltage to a reference minimum threshold voltage; and
  incrementally increasing the programming current and repeatedly applying the programming current to the memory cell, measuring the resulting threshold voltage, and comparing the resulting threshold voltage, until the resulting threshold voltage is greater or equal to a reference minimum threshold voltage.

3. The method of claim 1, wherein incrementally increasing a programming current to a memory cell comprises incrementally increasing a programming current to a phase change memory and switch (PCMS) memory cell until a threshold voltage resulting from the incremented programming current is greater or equal to a reference minimum threshold voltage.

4. The method of claim 1, wherein determining a final placement programming current value from a look-up table comprises determining a final placement programming current from a look-up table of a correlation of a predicted programming current needed to substantially result in a maximum threshold voltage based on an initial current which substantially results in a minimum threshold voltage, wherein the look-up table is generated from actual data from a the memory cell.

5. The method of claim 1, wherein determining a final placement programming current value from a look-up table comprises determining a final placement programming current from a look-up table of a correlation of a predicted programming current needed to substantially result in a maximum threshold voltage based on an initial current which substantially results in a minimum threshold voltage, wherein the look-up table is generated from an equation comprising:

$$V_t = V_t\min + (E_{th} \cdot L \cdot [1 - ((J_{cr} \cdot S)^2 / I^2)])$$

where: $V_t$ is the threshold voltage
$V_t\min$ is a reference minimum threshold voltage
$E_{th}$ is a parameter based on the phase change material used with some sensitivity to the device architecture
L is the device thickness
$J_{cr}$ is a parameter based on the phase change material used with some sensitivity to the device architecture
S is the device area
I is the current.

6. The method of claim 5, wherein $E_{th}$ is about 3.2e5 V/cm.

7. The method of claim 5, wherein $J_{cr}$ is about 1.2e7 A/cm².

8. A non-volatile memory, comprising:
a phase change memory and switch (PCMS) memory cell; and
a stored look-up table accessible to reset the PCMS memory cell;
wherein the stored look-up table is a correlation of a predicted programming current needed to substantially result in a maximum threshold voltage based on an initial current which substantially results in a minimum threshold voltage, and wherein the look-up table is generated from an equation comprising:

$$V_t = V_t\min + (E_{th} \cdot L \cdot [1 - ((J_{cr} \cdot S)^2 / I^2)])$$

where: $V_t$ is the threshold voltage
$V_t\min$ is a reference minimum threshold voltage
$E_{th}$ is a parameter based on the phase change material used with some sensitivity to the device architecture
L is the device thickness
$J_{cr}$ is a parameter based on the phase change material used with some sensitivity to the device architecture
S is the device area
I is the current.

9. The non-volatile memory of claim 8, wherein $E_{th}$ is about 3.2e5 V/cm.

10. The non-volatile memory of claim 8, wherein $J_{cr}$ is about 1.2e7 A/cm².

11. A system, comprising:
a controller; and
a non-volatile memory comprising a phase change memory and switch (PCMS) memory cell, and a stored look-up table accessible to reset the PCMS memory cell;
wherein the stored look-up table is a correlation of a predicted programming current needed to substantially result in a maximum threshold voltage based on an initial current which substantially results in a minimum threshold voltage, and wherein the look-up table is generated from an equation comprising:

$$V_t = V_t\min + (E_{th} \cdot L \cdot [1 - ((J_{cr} \cdot S)^2 / I^2)])$$

where: $V_t$ is the threshold voltage
$V_t\min$ is a reference minimum threshold voltage
$E_{th}$ is a parameter based on the phase change material used with some sensitivity to the device architecture
L is the device thickness
$J_{cr}$ is a parameter based on the phase change material used with some sensitivity to the device architecture
S is the device area
I is the current.

12. The system of claim 11, wherein $E_{th}$ is about 3.2e5 V/cm.

13. The system of claim 11, wherein $J_{cr}$ is about 1.2e7 A/cm².

* * * * *

UNITED STATES PATENT AND TRADEMARK OFFICE
CERTIFICATE OF CORRECTION

PATENT NO. : 8,462,537 B2  
APPLICATION NO. : 13/052211  
DATED : June 11, 2013  
INVENTOR(S) : Elijah V. Karpov et al.

Page 1 of 1

It is certified that error appears in the above-identified patent and that said Letters Patent is hereby corrected as shown below:

In the Claims

In column 7, line 26, in claim 5, line 9, delete " $V_t = V_t \min + (E_{th} \cdot L \cdot [1 - ((J_{cr} \cdot S)^2 / I^2)])$ " and insert -- $V_t = V_t \min + (E_{th} \cdot L \cdot [1 - ((J_{cr} \cdot S)^2 / I^2)])$ --, therefor.

In column 8, line 5, in claim 8, line 5, delete " $V_t = V_t \min + (E_{th} \cdot L \cdot [1 - ((J_{cr} \cdot S)^2 / I^2)])$ " and insert -- $V_t = V_t \min + (E_{th} \cdot L \cdot [1 - ((J_{cr} \cdot S)^2 / I^2)])$ --, therefor.

In column 8, line 31, in claim 11, line 12, delete " $V_t = V_t \min + (E_{th} \cdot L \cdot [1 - ((J_{cr} \cdot S)^2 / I^2)])$ " and insert -- $V_t = V_t \min + (E_{th} \cdot L \cdot [1 - ((J_{cr} \cdot S)^2 / I^2)])$ --, therefor.

Signed and Sealed this  
Tenth Day of September, 2013

Teresa Stanek Rea  
*Acting Director of the United States Patent and Trademark Office*